United States Patent
Kwon et al.

(10) Patent No.: US 8,593,319 B2
(45) Date of Patent: Nov. 26, 2013

(54) IMAGE SENSORS AND IMAGE PROCESSING SYSTEMS

(75) Inventors: Min-Ho Kwon, Seoul (KR); Seog-Heon Ham, Suwon-si (KR); Jeong-Jin Roh, Ansan-si (KR); Jae-Jin Yeo, Ansan-si (KR); Yong-Suk Choi, Ansan-si (KR); Gun-Hee Han, Seoul (KR)

(73) Assignees: Samsung Electronics Co., Ltd., Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 13/611,451

(22) Filed: Sep. 12, 2012

(65) Prior Publication Data

US 2013/0162857 A1 Jun. 27, 2013

(30) Foreign Application Priority Data

Dec. 26, 2011 (KR) ........................ 10-2011-0142279

(51) Int. Cl.
*H03M 3/00* (2006.01)

(52) U.S. Cl.
USPC .......................................... 341/143; 341/155

(58) Field of Classification Search
USPC .................................................. 341/143, 155
See application file for complete search history.

(56) References Cited

U.S. PATENT DOCUMENTS

| 6,456,170 | B1 | 9/2002 | Segawa et al. | |
|---|---|---|---|---|
| 7,408,138 | B2 * | 8/2008 | Lee | 250/208.1 |
| 8,081,098 | B2 * | 12/2011 | Yoo et al. | 341/143 |
| 2002/0041249 | A1 | 4/2002 | Ueno | |

FOREIGN PATENT DOCUMENTS

| JP | 08316801 A | 11/1996 |
|---|---|---|
| JP | 2000349604 A | 12/2000 |
| JP | 2002118448 A | 4/2002 |

* cited by examiner

*Primary Examiner* — Khai M Nguyen
(74) *Attorney, Agent, or Firm* — Harness, Dickey & Pierce

(57) ABSTRACT

An image sensor includes a delta-sigma analog-to-digital converter (ADC) including a delta-sigma modulator (DSM) and a voltage adjusting circuit. The DSM is configured to perform delta-sigma modulation on an analog signal from a unit pixel. The delta-sigma ADC is configured to convert the analog signal to a digital signal. The voltage adjusting circuit includes a replica inverter having a same configuration as at least one inverter included in the DSM. The voltage adjusting circuit is configured to adjust a power supply voltage and an input voltage provided to the at least one inverter based on a current flowing in the replica inverter.

19 Claims, 10 Drawing Sheets

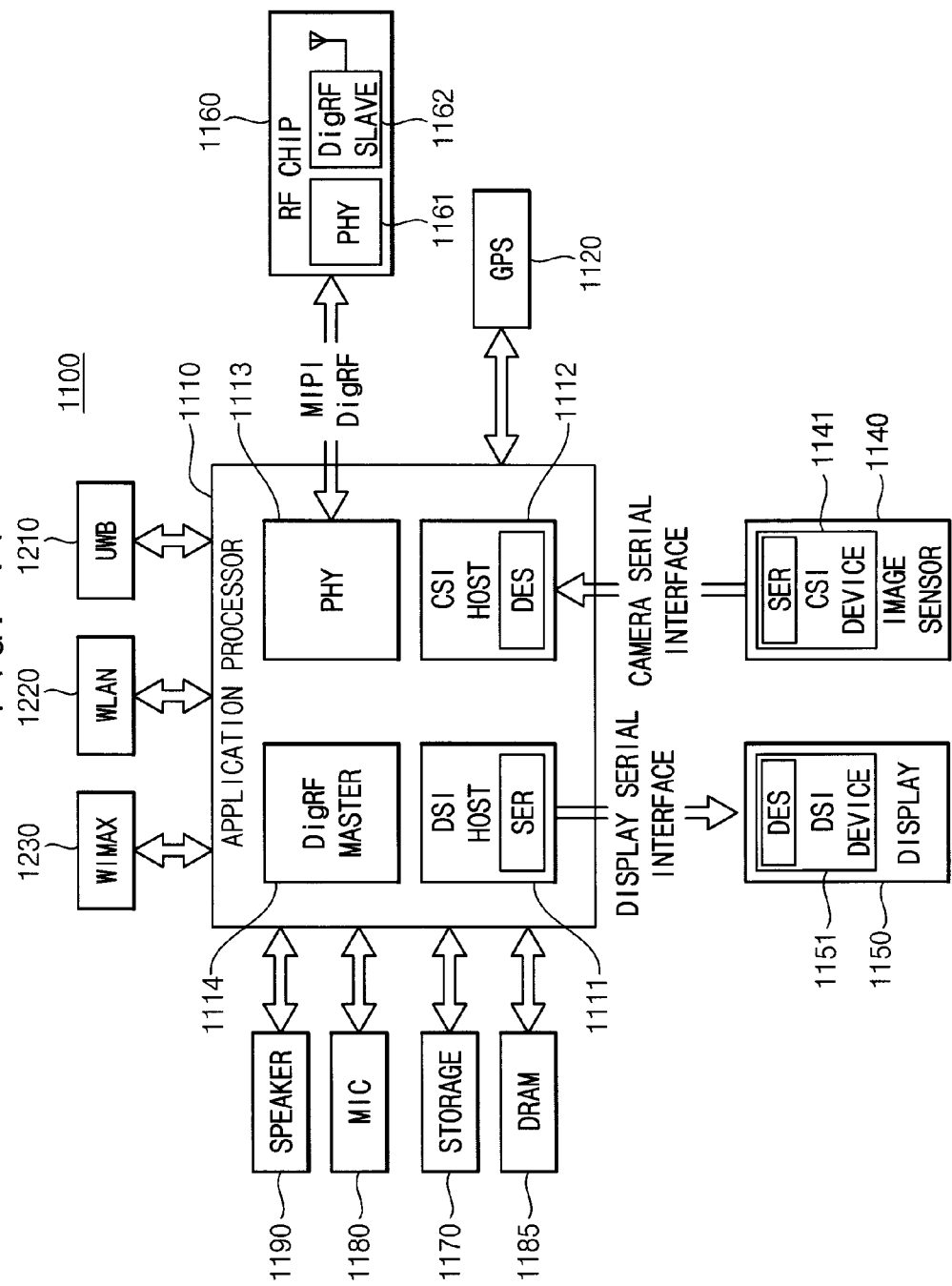

IMAGE SENSORS AND IMAGE PROCESSING SYSTEMS

CROSS-REFERENCE TO RELATED APPLICATIONS

This application claims priority under 35 USC §119 to Korean Patent Application No. 10-2011-0142279, filed on Dec. 26, 2011 in the Korean Intellectual Property Office (KIPO), the contents of which are herein incorporated by reference in its entirety.

BACKGROUND

1. Technical Field

Example embodiments relate to image processing, and more particularly to an image sensor and a image processing system including the same.

2. Description of the Related Art

Various digital signal processing systems require signal converting devices that convert analog signals to digital signals for digital signal processing. One of these signal converting devices may be an analog-to-digital converter (ADC). The ADC may have hardware complexity and performance variance due to process variance.

SUMMARY

Some example embodiments provide an image sensor that has a regular performance despite process variances.

Some example embodiments provide an image processing system including the image sensor.

In some example embodiments, an image sensor includes a delta-sigma analog-to-digital converter (ADC) including a delta-sigma modulator (DSM) and a voltage adjusting circuit. The DSM performs delta-sigma modulation on an analog signal from a unit pixel. The delta-sigma ADC converts the analog signal to a digital signal. The voltage adjusting circuit includes a replica inverter having a same configuration as at least one inverter included in the DSM. The voltage adjusting circuit adjusts a power supply voltage and an input voltage provided to the at least one inverter based on a current flowing in the replica inverter.

In some example embodiments, the voltage adjusting circuit may further include a sensing circuit that senses first and second sensing voltage converted form the current flowing in the replica inverter to provide an output sensing signal; a first comparator that compares the output sensing signal and a first reference voltage to adjust a level of the adjusted power supply voltage; and a second comparator that compares the second sensing voltage and a second reference voltage to adjust a level of the adjusted input voltage.

The replica inverter may include a p-channel metal-oxide semiconductor (PMOS) transistor that has a source coupled to the adjusted power supply voltage and a gate receiving the adjusted input voltage; a first resistor coupled to a drain of the PMOS transistor; and an n-channel metal-oxide semiconductor (NMOS) transistor that has a drain coupled to the first resistor, a gate receiving the adjusted input voltage and a source coupled to a ground voltage.

The first sensing voltage may be provided at the drain of the PMOS transistor and the second sensing voltage may be provided at the drain of the NMOS transistor.

The sensing circuit may include a first operational amplifier that has a first positive input terminal receiving the first sensing voltage and a first negative input terminal connected to a first output terminal; a second operational amplifier that has a second positive input terminal receiving the second sensing voltage and a second negative input terminal connected to a second output terminal; and a third operational amplifier that has a third negative input terminal coupled to the first output terminal through a second resistor, a third positive input terminal coupled to the second output terminal through a third resistor and third output terminal coupled to the third negative input terminal through a fourth resistor. The first negative input terminal is coupled to the second negative input terminal through a fifth resistor, the third positive input terminal is coupled to the ground voltage through a sixth resistor and the third output terminal provides the output sensing signal.

The second and third resistors may have a same first resistance, the fifth and sixth resistors may have a same second resistance, and the second resistance may be as twice as the first resistance.

The NMOS transistor may operate in a saturation region in response to the adjusted input voltage.

In some example embodiments, the image sensor may further include a regulator unit that maintains level of the power supply voltage and the input voltage to provide the power supply voltage and the input voltage to the delta-sigma ADC.

The regulator unit may include a first regulator that maintains the level of the power supply voltage to be provided to at least one inverter included in the DSM; and a second regulator maintains the level of the input voltage to be provided to the least one inverter included in the DSM.

In some example embodiments, the delta-sigma ADC may further include a digital filter, connected to an output of the DSM, which provides the digital signal.

In some example embodiments, the DSM may include a plurality of cascade-connected switched-capacitor integrators. Each of the switched-capacitor integrators performs a sampling operation on corresponding input signal in a first clock phase and performs an integration operation using corresponding inverter in a second clock phase.

In some example embodiments, each of the switched-capacitor integrators may reset an input signal of the corresponding inverter to a reset voltage in a reset operation.

In some example embodiments, an image processing system includes an image sensor and a processor that processes an output signal from the image signal. The image sensor includes a delta-sigma analog-to-digital converter (ADC) including a delta-sigma modulator (DSM) and a voltage adjusting circuit. The DSM performs delta-sigma modulation on an analog signal from a unit pixel. The delta-sigma ADC converts the analog signal to a digital signal. The voltage adjusting circuit includes a replica inverter having a same configuration as at least one inverter included in the DSM. The voltage adjusting circuit adjusts a power supply voltage and an input voltage provided to the at least one inverter based on a current flowing in the replica inverter.

Accordingly, the image sensor and image processing system include the voltage adjusting circuit having a replica inverter that has a same configuration as the inverters of DSM in delta-sigma ADC and adjust the levels of the power supply voltage and the input voltage such that the regular current flows in the inverters without regard to the variance of PVT.

BRIEF DESCRIPTION OF THE DRAWINGS

Illustrative, non-limiting example embodiments will be more clearly understood from the following detailed description taken in conjunction with the accompanying drawings.

FIG. 14 is a block diagram illustrating an example of an interface used in a computing system of FIG. 13 according to some example embodiments.

DETAILED DESCRIPTION OF EXAMPLE EMBODIMENTS

Figure 1:
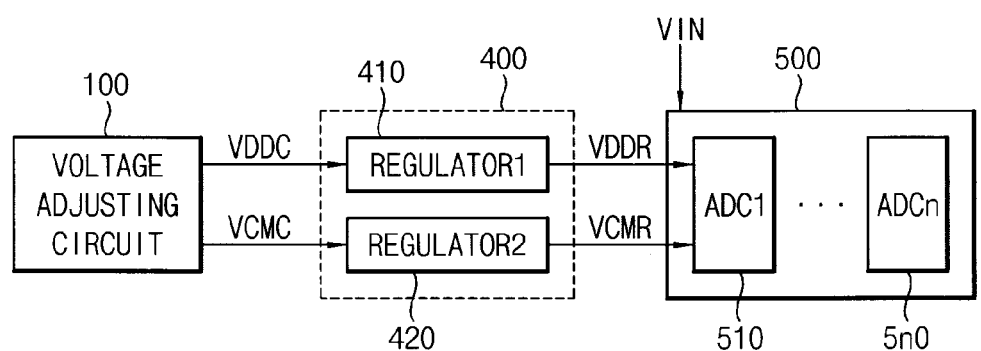
FIG. 1 is a block diagram illustrating an image sensor according to some example embodiments.

Various example embodiments will be described more fully hereinafter with reference to the accompanying drawings, in which some example embodiments are shown. Example embodiments of the inventive concepts may, however, be embodied in many different forms and should not be construed as limited to the example embodiments set forth herein. Rather, these example embodiments are provided so that this disclosure will be thorough and complete, and will fully convey the scope of example embodiments of the inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the example embodiments of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises" and; or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an image sensor according to some example embodiments.

Referring to FIG. 1, an image sensor 10 may include a voltage adjusting circuit 100, a regulator unit 400 and an analog-to-digital converting unit 500.

The regulator unit 400 includes first and second regulators 410 and 420 and the analog-to-digital converting unit 500 includes a plurality of delta-sigma analog-to-digital converters (ADCs) 510~5n0 that are arranged in parallel in a column direction. The image sensor 10 may further include other components that are not illustrated.

The voltage adjusting circuit 100 provides an adjusted power supply voltage VDDC and adjusted input voltage VCMC. The first regulator 410 maintains a level of the adjusted power supply voltage VDDC to provide a regulated power supply voltage VDDR to the analog-to-digital converting unit 500 and the second regulator 420 maintains a level of the adjusted input voltage VCMR to provide a regulated input voltage VCMR to the analog-to-digital converting unit 500.

A delta-sigma modulator (DSM) (Refer to FIG. 3) in the analog-to-digital converting unit 500 performs a delta-sigma modulation on an analog signal VIN from a unit pixel, and each of the delta-sigma ADCs 510~5n0 converts the analog signal VIN to a digital signal. The voltage adjusting circuit 100 includes a replica inverter (Refer to 110 in FIG. 6) that has a same configuration as at least one inverter in the DSM and adjusts the power supply voltage VDDC and the input voltage VCMC provided to the at least one inverter in the DSM.

Figure 2:
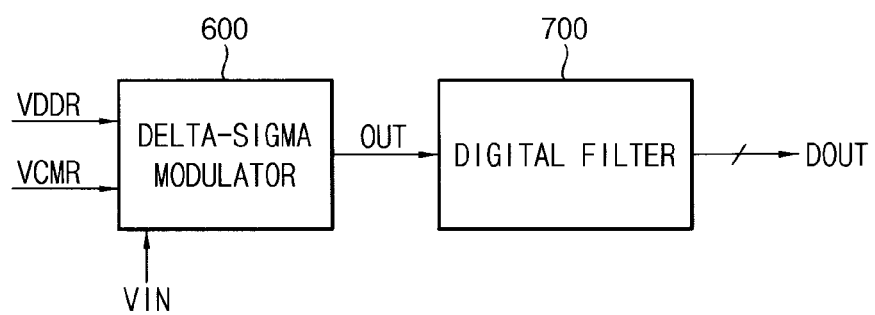
FIG. 2 is a block diagram illustrating one of the delta-sigma analog-to-digital converters in FIG. 1 according to some example embodiments.

FIG. 2 is a block diagram illustrating one of the delta-sigma analog-to-digital converters in FIG. 1 according to some example embodiments.

Referring to FIG. 2, a delta-sigma ADC 510 may include a DSM 600 and a digital filter 700.

The DSM 600 performs delta-sigma modulation on the input signal VIN to generate N-bit (N is a natural number) code stream OUT. The digital filter 700 may reduce high-frequency component noise by low-pass filtering the N-bit code stream OUT or may lower a transmission speed of a digital output data DOUT by employing a decimation filter.

Figure 3A:
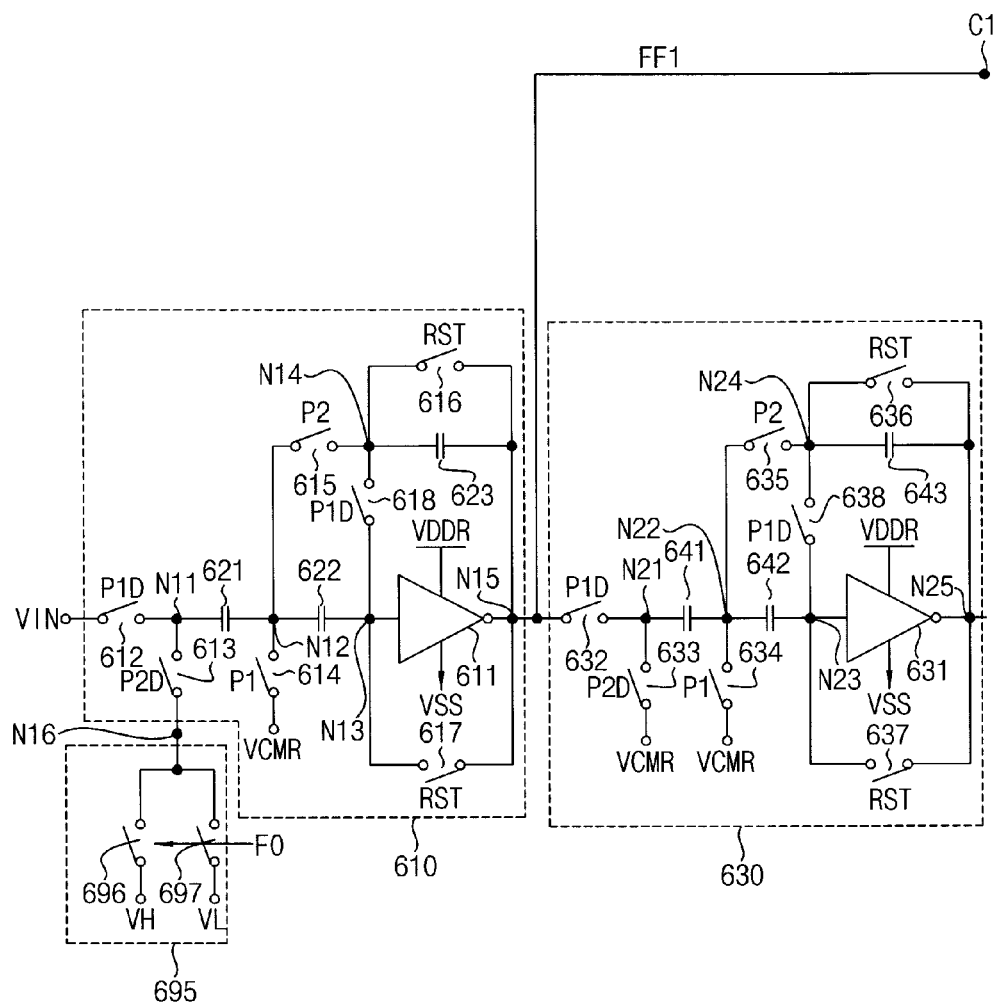
FIGS. 3A and 3B are a circuit diagram illustrating an example of the delta-sigma analog-to-digital converter of FIG. 2 according to some example embodiments.
Figure 3B:
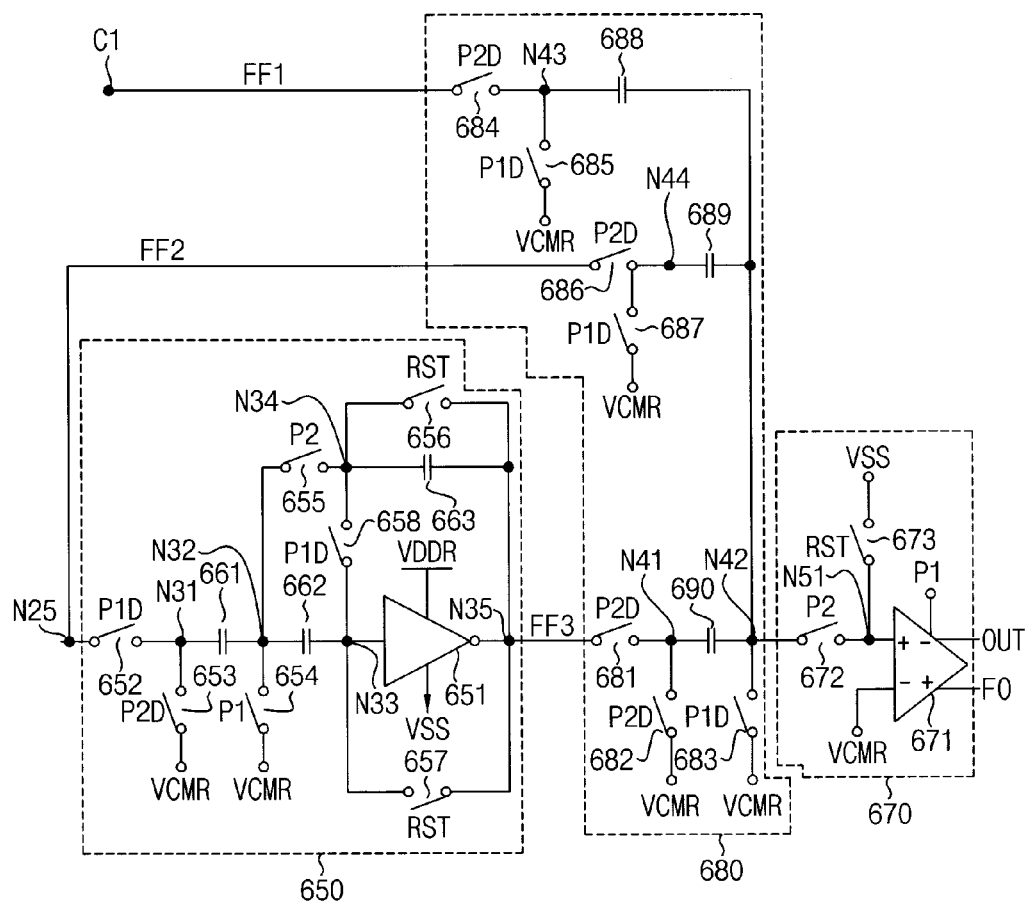

FIGS. 3A and 3B are a circuit diagram illustrating an example of the delta-sigma analog-to-digital converter of FIG. 2 according to some example embodiments.

Referring to FIGS. 3A and 3B, a DSM 600a and 600b may include first through third switched-capacitor integrators 610, 630 and 650, a comparing circuit 670, a summing circuit 680 and a voltage providing circuit 695. For example, DSM 600a and 600b include a plurality of cascade-connected switched-capacitor integrators 610, 630 and 650, and each of the switched-capacitor integrators 610, 630 and 650 includes each of inverters 611, 631 and 651.

The first switched-capacitor integrator 610 includes an inverter 611, a plurality of switches 612~618 and a plurality of capacitors 621~623. The switch 612 is connected between the analog input signal VIN and a node N11 and is turned on/off in response to a first delay clock signal P1D. The switch 613 is connected between the node N11 and a node N16 to which the voltage providing circuit 695 is connected, and is turned on/off in response to a second delay clock signal P2D. The switch 614 is connected between a terminal where the regulated input voltage VCMR is applied and the node N12, and is turned on/off in response to a first clock signal P1. The switch 615 is connected between the node N12 and a node N14 and is turned on/off in response to a second clock signal P2. The switch 616 is connected between the node N14 and a node N15 and is turned on/off in response to a reset signal RST. The switch 617 is connected between a node N13 and a node N15 and is turned on/off in response to the reset signal RST. The switch 618 is connected between the node N13 and a node N14 and is turned on/off in response to the first delay clock signal P1D. The capacitor 621 is connected between the nodes N11 and N12 and operates as a sampling capacitor. The capacitor 622 is connected between the nodes N12 and N13 and operates as a coupling capacitor. The capacitor 623 is connected between the nodes N14 and N15 and operates as an integration capacitor.

The second switched-capacitor integrator 630 includes an inverter 631, a plurality of switches 632~638 and a plurality of capacitors 641~643. The switch 632 is connected between the node N15 that corresponds to an output of the inverter 611 and a node N21 and is turned on/off in response to the first delay clock signal P1D. The switch 633 is connected between the node N21 and a terminal where the regulated input voltage VCMR is applied, and is turned on/off in response to the second delay clock signal P2D. The switch 634 is connected between a terminal where the regulated input voltage VCMR is applied and the node N22, and is turned on/off in response to the first clock signal P1. The switch 635 is connected between the node N22 and a node N24 and is turned on/off in response to the second clock signal P2. The switch 636 is connected between the node N24 and a node N25 and is turned on/off in response to the reset signal RST. The switch 637 is connected between a node N23 and a node N25 and is turned on/off in response to the reset signal RST. The switch 638 is connected between the node N23 and a node N24 and is turned on/off in response to the first delay clock signal P1D. The capacitor 641 is connected between the nodes N21 and N22 and operates as a sampling capacitor. The capacitor 642 is connected between the nodes N22 and N23 and operates as a coupling capacitor. The capacitor 643 is connected between the nodes N24 and N25 and operates as an integration capacitor.

The third switched-capacitor integrator 650 includes an inverter 651, a plurality of switches 652~658 and a plurality of capacitors 661~663. The switch 652 is connected between the node N25 that corresponds to an output of the inverter 631 and a node N31 and is turned on/off in response to the first delay clock signal P1D. The switch 653 is connected between the node N31 and a terminal where the regulated input voltage VCMR is applied, and is turned on/off in response to the second delay clock signal P2D. The switch 654 is connected between a terminal where the regulated input voltage VCMR is applied and the node N32, and is turned on/off in response to the first clock signal P1. The switch 655 is connected between the node N32 and a node N34 and is turned on/off in response to the second clock signal P2. The switch 656 is connected between the node N34 and a node N35 and is turned on/off in response to the reset signal RST. The switch 657 is connected between a node N33 and a node N35 and is turned on/off in response to the reset signal RST. The switch 658 is connected between the node N33 and a node N34 and is turned on/off in response to the first delay clock signal P1D. The capacitor 661 is connected between the nodes N31 and N32 and operates as a sampling capacitor. The capacitor 662 is connected between the nodes N32 and N33 and operates as a coupling capacitor. The capacitor 663 is connected between the nodes N34 and N35 and operates as an integration capacitor.

The voltage providing circuit 695 includes switches 696 and 697. The switch 696 is connected between the node N16 and a terminal to which a first voltage VH is applied and is turned on/off in response to a code stream FO from the comparing circuit 670. The switch 697 is connected between the node N16 and a terminal to which a second voltage VL is applied and is turned on/off alternatively with the switch 696 in response to a code stream FO from the comparing circuit 670.

The summing circuit 680 includes a plurality of switches 681~687 and a plurality of capacitors 688~690. The switch 681 is connected between the node N35 and a node N41 and is turned on/off in response to the second delay clock signal P2D. The switch 682 is connected between the node N41 and a terminal where the regulated input voltage VCMR is applied, and is turned on/off in response to the second delay clock signal P2D. The switch 683 is connected between a node N42 and a terminal where the regulated input voltage VCMR is applied, and is turned on/off in response to the first delay clock signal P1D. The switch 684 is connected between the node N15 and a node N43, and is turned on/off in response to the second delay clock signal P2D. The switch 685 is connected between the node N43 and a terminal where the regulated input voltage VCMR is applied, and is turned on/off in response to the first delay clock signal P1D. The switch 686 is connected between the node N25 and a node N44, and is turned on/off in response to the second delay clock signal P2D. The switch 687 is connected between the node N44 and a terminal where the regulated input voltage VCMR is applied, and is turned on/off in response to the first delay clock signal P1D. The capacitor 688 is connected between the nodes N43 and N42. The capacitor 689 is connected between the nodes N44 and N42. The capacitor 690 is connected between the nodes N41 and N42. The capacitors 688, 689 and 690 operate as a sampling capacitor.

The comparing circuit 670 includes a latched comparator 671 and switches 672 and 673. The switch 672 is connected between the node N42 and a node N51, and is turned on/off in response to the second clock signal P2. The switch 673 is connected between the node N51 and a ground voltage VSS and is turned on/off in response to the reset signal RST. The latched comparator 671 has a positive input terminal coupled to the node N51 and a negative input terminal receiving the regulated input voltage VCMR. The latched comparator 671 has a negative output terminal providing the N-bit code stream and a positive output terminal providing the code stream F. In addition, the latched comparator 671 operates in synchronization with the first clock signal P1.

Figure 4:
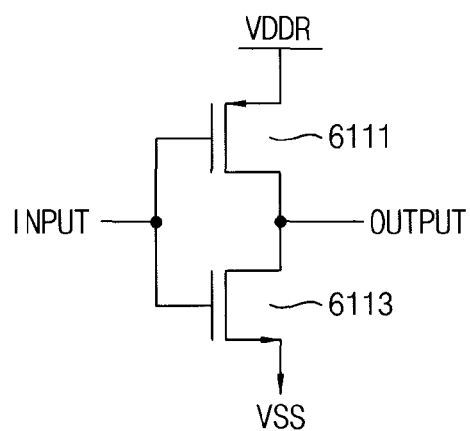
FIG. 4 illustrates one of the inverters in the DSM according to some example embodiments.

FIG. 4 illustrates one of the inverters in the DSM according to some example embodiments.

Referring to FIG. 4, an inverter 611 may include a PMOS transistor 6111 and a NMOS transistor 6113 cascode-connected between the regulated power supply voltage VDDR and the regulated input voltage VCMR.

Figure 5:
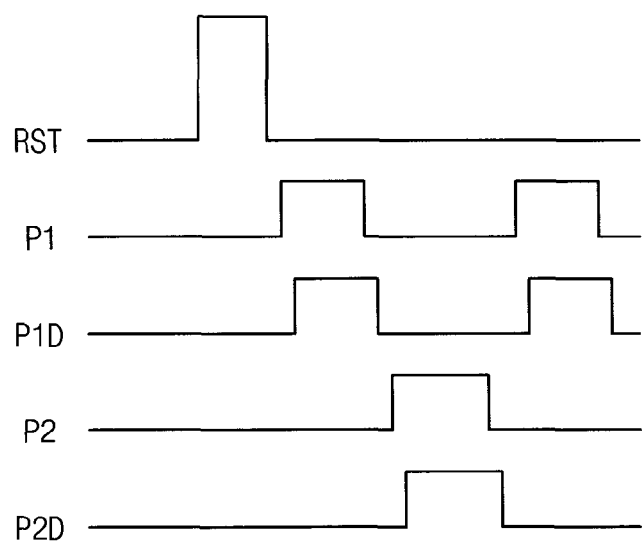
FIG. 5 illustrates a reset signal and clock signals applied to the switches in the DSM of FIG. 3.

FIG. 5 illustrates a reset signal and clock signals applied to the switches in the DSM of FIG. 3.

In FIG. 5, a reset mode refers to a case when the reset signal RST is activated, a first clock phase (or a sampling mode) refers to a case when the first clock signal P1 and the first delay clock signal P1D are activated and a second clock phase (or an integration mode) refers to a case when the second clock signal P2 and the second delay clock signal P2D are activated. In addition, the first clock signal P1 and the first delay clock signal P1D are non-overlapped with the second clock signal P2 and the second delay clock signal P2D.

Hereinafter, the operation of the DSM with reference to FIG. 3A through FIG. 5 will be described.

If the reset signal RST is activated to a first logic level (high level) in the reset mode, the switches 616, 617, 636, 637, 656, 657 and 673 are switched on (connected). If the switches 616, 617, 636, 637, 656, 657 and 673 are switched on, each input and output of the inverters 611, 631 and 651 are connected to each other, and each of the inverters 611, 631 and 651 are reset with a reset voltage. The positive output terminal of the latched comparator 671 is reset with the ground voltage VSS.

The first switched-capacitor integrator 610 performs a sampling operation in the first clock phase, and performs an amplification and/or integration operation (integration operation) in the second clock phase. Since the switches 612, 614 and 616 are turned on (connected) in the sampling mode, the capacitor 621 samples a voltage corresponding to a difference between the analog input signal VIN and the regulated input voltage VCMR, and the capacitor 623 is connected between the nodes N13 and N15. That is, the capacitor 623 is connected between the input and output of the inverter 611. In the integration mode, since the switches 613 and 615 are turned on, the inverter 611 integrates the voltage sampled in the capacitor 621 using the capacitors 621, 622 and 623 and outputs the integrated voltage as a first output voltage FF1.

The second switched-capacitor 630 performs a sampling operation in the first clock phase, and performs an integration operation in the second clock phase. Since the switches 632, 634 and 636 are turned-on (connected) in the sampling mode, the capacitor 641 samples a voltage corresponding to a difference between the first output signal FF1 and the regulated input voltage VCMR, and the capacitor 643 is connected between the nodes N23 and N25. That is, the capacitor 643 is connected between the input and output of the inverter 631. In the integration mode, since the switches 633 and 635 are turned on, the inverter 631 integrates the voltage sampled in the capacitor 641 using the capacitors 641, 642 and 643 and outputs the integrated voltage as a second output voltage FF2.

The third switched-capacitor 650 performs a sampling operation in the first clock phase, and performs an integration operation in the second clock phase. Since the switches 652, 654 and 656 are turned-on (connected) in the sampling mode, the capacitor 661 samples a voltage corresponding to a difference between the second output signal FF2 and the regulated input voltage VCMR, and the capacitor 663 is connected between the nodes N33 and N35. That is, the capacitor 663 is connected between the input and output of the inverter 651. In the integration mode, since the switches 653 and 655 are turned on, the inverter 651 integrates the voltage sampled in the capacitor 661 using the capacitors 661, 662 and 663 and outputs the integrated voltage as a third output voltage FF3.

Since the switches 682, 683, 685 and 687 are turned on in the first clock phase, the regulated input voltage VCMR is applied to terminals of each of the capacitors 688, 689 and 690, and thus the capacitors 688, 689 and 690 are reset. Since the switches 681, 684 and 686 are turned on in the second clock phase, the first output voltage FF1 is sampled in the capacitor 688 and transmitted to the node N42, the second output voltage FF2 is sampled in the capacitor 589 and transmitted to the node N42 and the third output voltage FF3 is sampled in the capacitor 590 and transmitted to the node N42. The first through third output voltages FF1, FF2 and FF3 are summed in the node N42 and the latched comparator 671 compares the voltage at the node N42 and the regulated input voltage VCMR to output the N-bit code streams OUT and FO in the second clock phase.

The switch 696 in the voltage providing circuit 695 provides the first voltage VH to the node N16 if the N-bit code stream FO is one of high level and low level, and the switch 697 in the voltage providing circuit 695 provides the second voltage VL to the node N16 if the N-bit code stream FO is the other of the high level and low level. That is, the switches 696 and 697 operate alternatively with respect to each other. In addition, the voltage providing circuit 695 may operate as a level shifter for shifting the level of the voltage sampled in the capacitor 621.

Each of the switched-capacitor integrators 610, 630 and 650 may perform the sampling operation on each of the respective input signals in the first clock phase, and may perform the sampling operation using each of the respective inverters. In addition, each of the capacitor integrators 610, 630 and 650 may reset the input of each of the respective inverters to a reset voltage.

Figure 6:
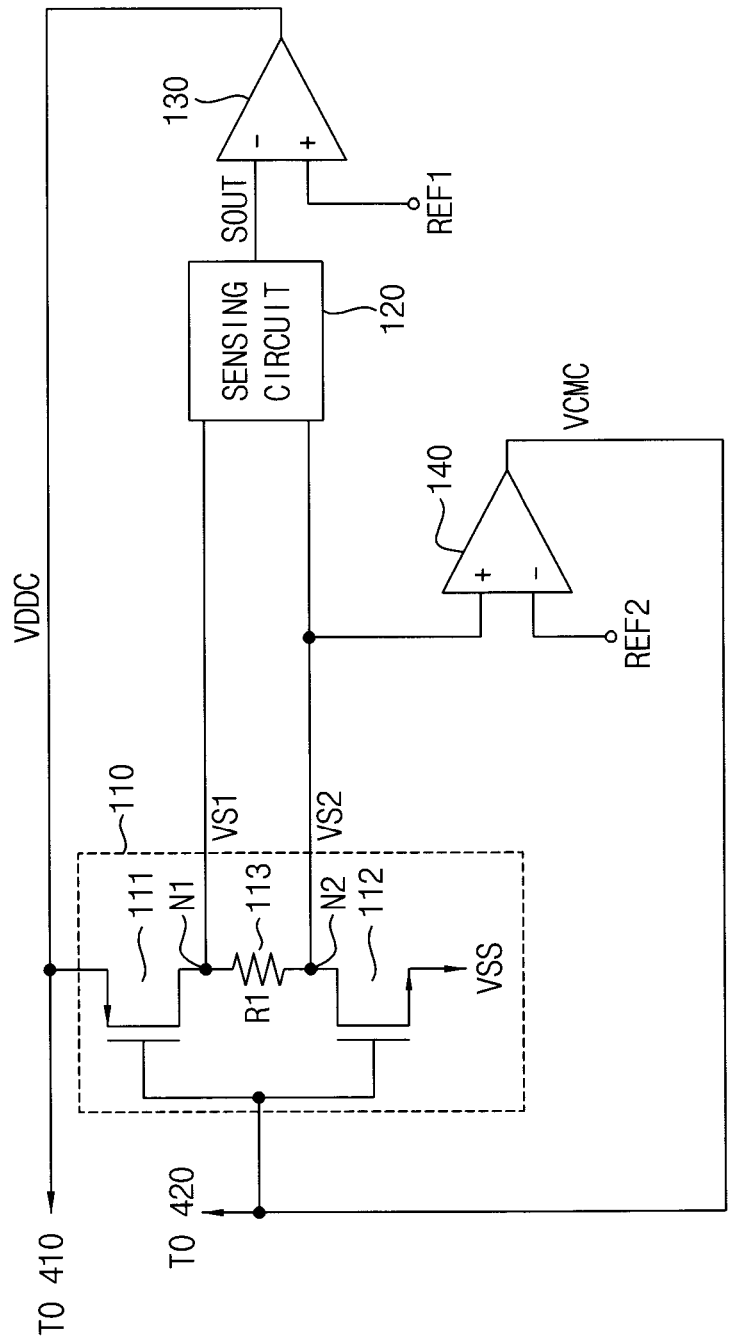
FIG. 6 is a circuit diagram illustrating an example of the voltage adjusting circuit in FIG. 1 according to some example embodiments.

FIG. 6 is a circuit diagram illustrating an example of the voltage adjusting circuit in FIG. 1 according to some example embodiments.

The voltage adjusting circuit 100 of FIG. 6 may be employed in general circuits that include inverters, and performance differences due to process variance may be reduced.

Referring to FIG. 6, the voltage adjusting circuit 100 may include a replica inverter 110, a sensing circuit 120, a first comparator 130 and a second comparator 140. The replica inverter 110 may have a same configuration as each of the inverters 611, 631 and 651 in the DSM 600 of FIG. 3. The replica inverter 110 includes a PMOS transistor 111, a NMOS transistor 112 and a resistor 113. The PMOS transistor 111 has a source coupled to the adjusted power supply voltage VDDC, a drain coupled to the resistor 113 at a node N1 and a gate receiving the adjusted input voltage VCMC. The NMOS transistor 112 has a drain coupled to the resistor 113 at a node N2, a source coupled to the ground voltage VSS and a gate receiving the adjusted input voltage VCMC. The resistor 113 is connected between the drain of the PMOS transistor 111 and the drain of the NMOS transistor 112. A first sensing voltage VS1 is provided at the node N1 and a second sensing voltage VS2 is provided at the node N2. That is, the first and second sensing voltages VS1 and VS2 are provided at two terminals of the resistor 113. The first and second sensing voltages VS1 and VS2 are used for measuring current flowing in the replica inverter 110. The sensing circuit 120 senses the current flowing in the replica inverter 110 based on the first and second sensing voltages VS1 and VS2 and converts the sensed current to a voltage to provide the output sensing signal SOUT to the first comparator 130. The sensing circuit 120 may sense the first and second sensing voltages VS1 and VS2 converted from the current flowing in the replica inverter 110 to provide the output sensing signal SOUT.

The first comparator 130 compares the output sensing signal SOUT and a first reference voltage REF1 to adjust the level of the adjusted power supply voltage VDDC to be provided to the source of the PMOS transistor 111 and the first regulator 410. For example, if the level of the output sensing signal SOUT is lower than the level of the first reference voltage REF1, the first comparator 130 raises the level of the adjusted power supply voltage VDDC. If the level of the adjusted power supply voltage VDDC is raised, the level of the output sensing signal SOUT, corresponding to voltage difference of two ends of the resistor 113, is also raised. For example, if the level of the output sensing signal SOUT is higher than the level of the first reference voltage REF1, the first comparator 130 lowers the level of the adjusted power supply voltage VDDC. If the level of the adjusted power supply voltage VDDC is lowered, the level of the output sensing signal SOUT is also lowered.

The second comparator 140 compares the second sensing voltage VS2 and a second reference voltage REF2 to adjust the level of the adjusted input voltage VCMC to be provided to the gates of the PMOS transistor 111 and NMOS transistor 112 and the second regulator 420. For example, if the level of the second sensing voltage VS2 is higher than the level of the second reference voltage REF2, the second comparator 140 raises the level of the adjusted input voltage VCMC. If the level of the adjusted input voltage VCMC is raised, the level of gate-source voltage of the NMOS transistor 112 is lowered and the level of the second sensing voltage VS2 is lowered. For example, if the level of the second sensing voltage VS2 is lower than the level of the second reference voltage REF2, the second comparator 130 lowers the level of the adjusted input voltage VCMC. If the level of the adjusted input voltage VCMC is lowered, the level of gate-source voltage of the NMOS transistor 112 is raised and thus, the level of the adjusted input voltage VCMC is raised. That is, the second comparator 140 adjusts the level of the adjusted input voltage VCMC based on difference of the second sensing voltage VS2 and the second reference voltage REF2 to render the NMOS transistor 112 to operate in a saturation region. Therefore, regular current may flow in the NMOS transistor 112 without regard to variances of the process, voltage and temperature (PVT).

Figure 7:
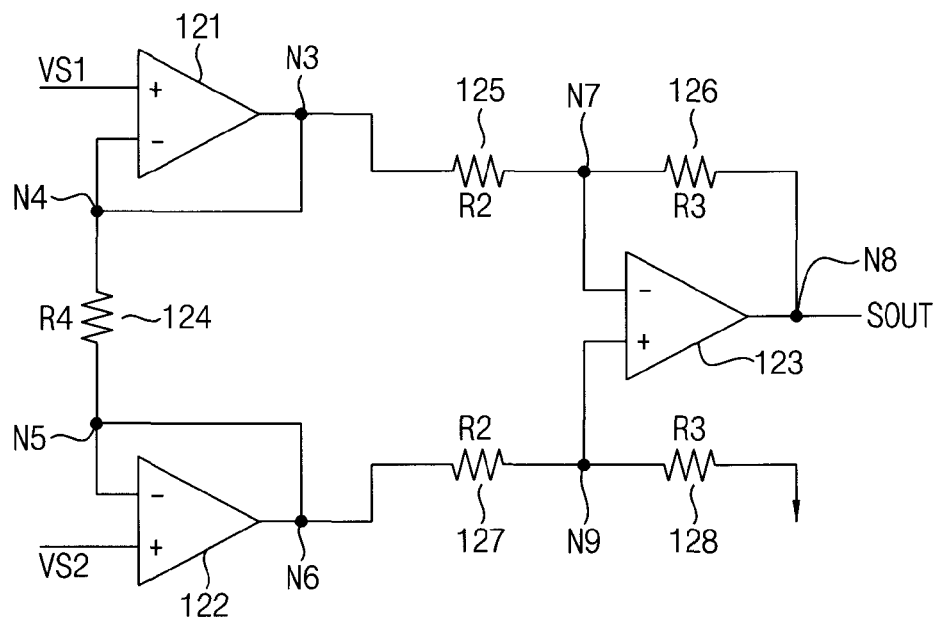
FIG. 7 is a circuit diagram illustrating an example of the sensing circuit in FIG. 6 according to some example embodiments.

FIG. 7 is a circuit diagram illustrating an example of the sensing circuit in FIG. 6 according to some example embodiments.

Referring to FIG. 7, a sensing circuit 120 may include operational amplifiers 121, 122 and 123 and resistors 124, 125, 126, 127 and 128.

The operational amplifier 121 has a first positive input terminal receiving the first sensing voltage VS1 and a first negative input terminal connected to the resistor 124 and a first output terminal. The operational amplifier 122 has a second positive input terminal receiving the second sensing voltage VS2 and a second negative input terminal connected to the resistor 124 and a second output terminal. The resistor 124 is connected between nodes N4 and N5. The resistor 125 is connected between nodes N3 and N7. The resistor 127 is connected between nodes N6 and N9. The operational amplifier 123 has a third positive input terminal connected to the node N9 a third negative input terminal connected to the node N7 and a third output terminal connected to a node N8. A resistor 126 is connected between the third output terminal and the third negative input terminal. The operational amplifier 123 provides the output sensing signal SOUT at the third output terminal. The resistor 128 is connected between the third positive input terminal and the ground voltage. The resistors 125 and 127 have a same first resistance. The resistors 126 and 128 have a same second resistance. The second resistance may be twice the first resistance. That is, the voltage of the output sensing signal SOUT may be as twice as the voltage difference of the two ends of the resistor 113 in FIG. 6. For example, if the voltage difference of the two ends of the resistor 113 in FIG. 6 165 mV, the voltage of the output sensing signal SOUT is 330 mV and the first reference voltage REF1 is 330 mV such that the regular current flows in the replica inverter 110 without regard to the variance of PVT. In addition, the second reference voltage REF2 may have a voltage such that the NMOS transistor 112 operates in the saturation region without regard to the variance of PVT. That is, the PMOS transistor 111 and the NMOS transistor 112 may have substantially the same drain-source voltages.

Figure 8:
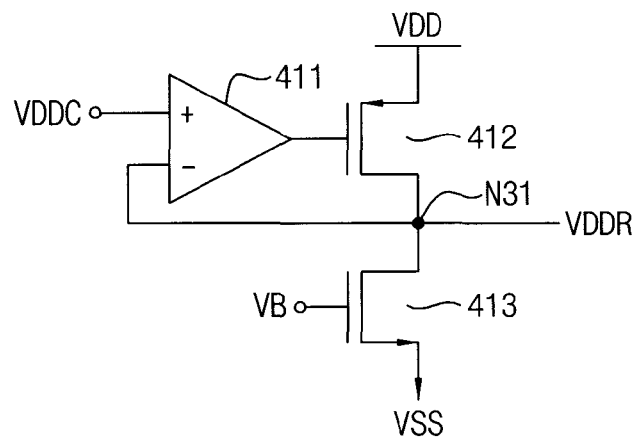
FIG. 8 is a circuit diagram illustrating an example of the first regulator in FIG. 1 according to some example embodiments.

FIG. 8 is a circuit diagram illustrating an example of the first regulator in FIG. 1 according to some example embodiments.

The second regulator 420 may have substantially same configuration as the first regulator 410.

Referring to FIG. 8, the first regulator 410 includes an operational amplifier 411, a PMOS transistor 412 and a NMOS transistor 413. The operational amplifier 411 has a positive input terminal receiving the adjusted power supply voltage VDDC. The PMOS transistor has a source connected to a power supply voltage VDD, a gate connected to an output terminal of the operational amplifier 411 and a drain connected to a node N32 and a negative input terminal of the operational amplifier 411. The regulated power supply voltage VDDR is provided at the node N31. The NMOS transistor 413 has a drain connected to the node N31, a gate receiving a bias voltage VB and a source connected to the ground voltage VSS. The first regulator 410 receives the adjusted power supply voltage VDDC to maintain the level of the regulated power supply voltage VDDR to be provided to the DSM 600.

The second regulator 420 receives the adjusted input voltage VCMC to maintain the level of the regulated input voltage VCMR to be provided to the DSM 600.

Figure 9:
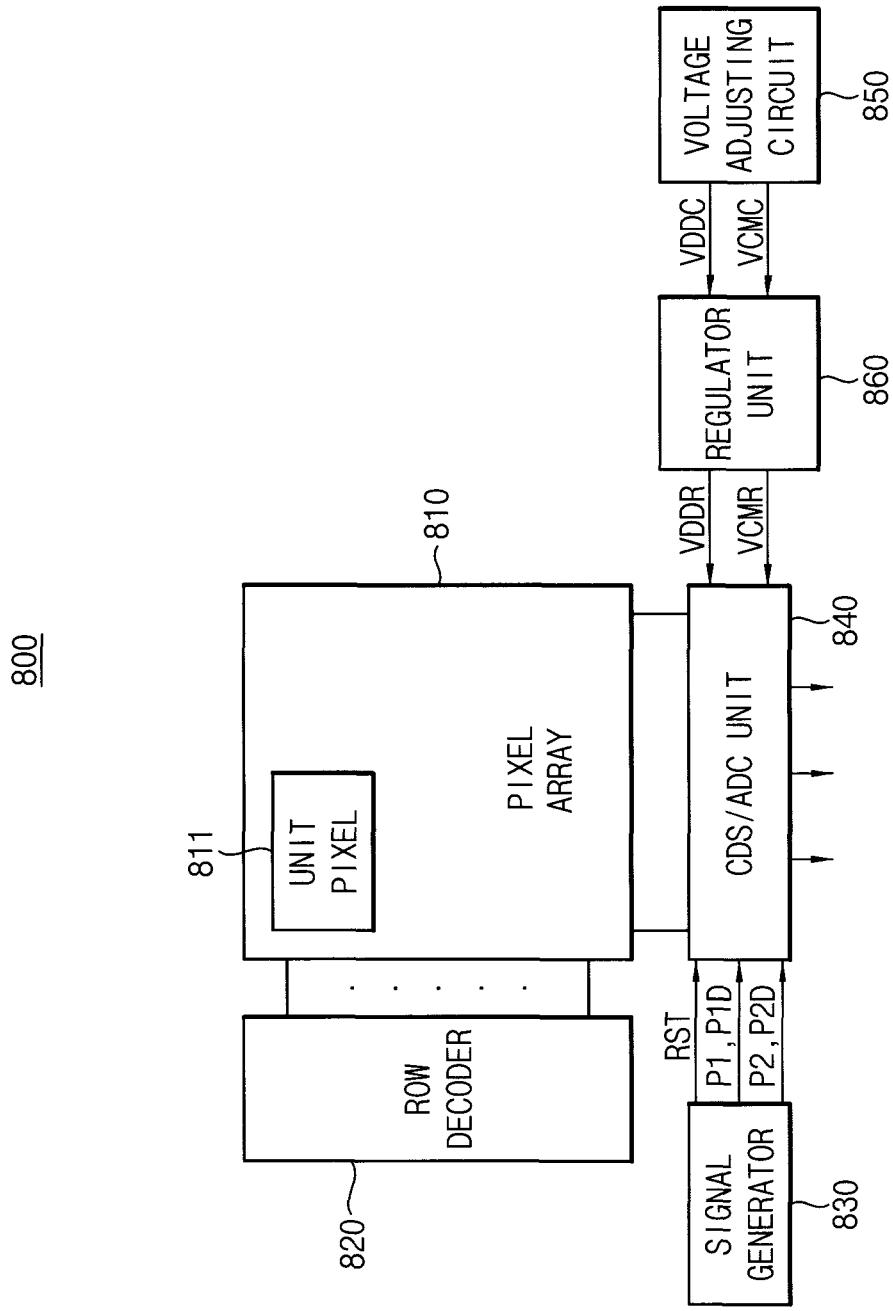
FIG. 9 is a block diagram illustrating an image sensor according to some example embodiments.

FIG. 9 is a block diagram illustrating an image sensor according to some example embodiments.

Referring to FIG. 9, an image sensor 800, an example of an image pick-up device, includes a pixel array 810 having a plurality of unit pixels 811, a row decoder 820, a signal generator 830 and an analog-to-digital converting block 840. The image sensor 800 may further include a voltage adjusting circuit 850 and a regulator unit 860. In addition, the image sensor 800 may be a complementary metal-oxide semiconductor (CMOS) image sensor fabricated using the CMOS fabrication process. The row decoder 820 provides a plurality of control signals for controlling the unit pixels 811. The signal generator 830 generates the signals RST, P1, P1D, P2 and P2D in FIG. 5. The analog-to-digital converting block 840 converts analog signals from the pixel array 810 to digital signals. The analog-to-digital converting block 840 includes a plurality of converting blocks, each connected to each of column lines.

Each of the unit pixels 811 may include the photoelectric converting element such as photo-diode, photo transistor or pinned photo-diode. Each of the unit pixels 811 converts an optical signal to an electric signal.

The voltage adjusting circuit 850 includes a replica inverter (Refer to 110 in FIG. 6) that has a same configuration as at least one inverter in the DSM 600 and adjusts the power supply voltage VDDC and the input voltage VCMC provided to the at least one inverter in the DSM 600 such that the regular current flows in the replica inverter 110 without regard to the variance of PVT as described with reference to FIGS. 1 through 8. The regulator unit 860 maintains the levels of the power supply voltage VDDR and the input voltage VCMR provided to the delta-sigma modulator in the analog-to-digital converting block 840. Therefore, the delta-sigma modulators in the analog-to-digital converting block 840 may have regular performance without regard to the variance of PVT if the delta-sigma modulators in the analog-to-digital converting block 840 are configured based on inverters.

Figure 10:
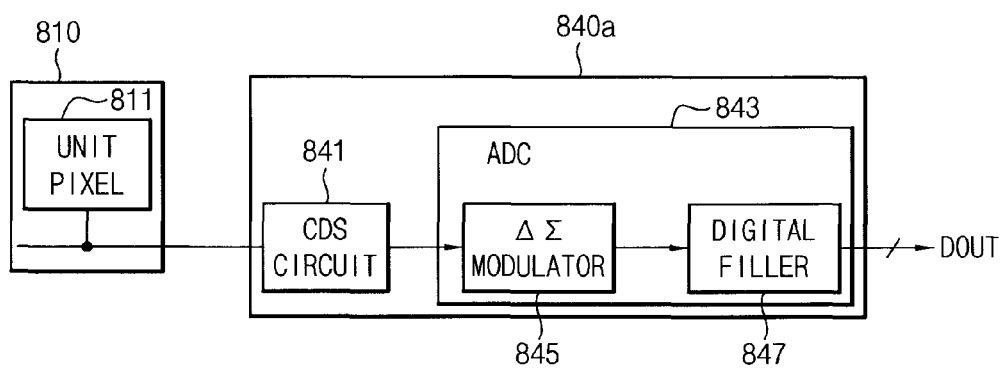
FIG. 10 is a block diagram illustrating an example of the image sensor of FIG. 9 according to some example embodiments.

FIG. 10 is a block diagram illustrating an example of the image sensor of FIG. 9 according to some example embodiments.

In FIG. 10, one unit pixel 811 and one converting block 840a are illustrated.

Referring to FIG. 10, the converting block 840a includes correlated double sampling (CDS) circuit 841 and an ADC 843. The CDS circuit 840 performs CDS on the analog signals including reset signals and image signals from the unit pixel 811 to output correlated double-sampled analog signals.

The ADC 843 converts the correlated double-sampled analog signals to digital signals. The ADC may 843 be a delta-sigma ADC. The ADC 843 includes a DSM 845 and a digital filter 847. The DSM 845 performs one of first clock phase operation, the second clock phase operation and reset mode operation based on the signals RST, P1, P1D, P2 and P2D in FIG. 5 as described with reference to FIG. 5. The DSM 845 may employ the DSM of FIGS. 3A and 3B. The DSM 845 performs the delta-sigma modulation on the correlated double-sampled analog signals to generate the N-bit code stream.

The digital filter 847 may reduce high-frequency component noise by low-pass filtering the N-bit code stream or may lower a transmission speed of a digital output data DOUT by employing a decimation filter.

Figure 11:
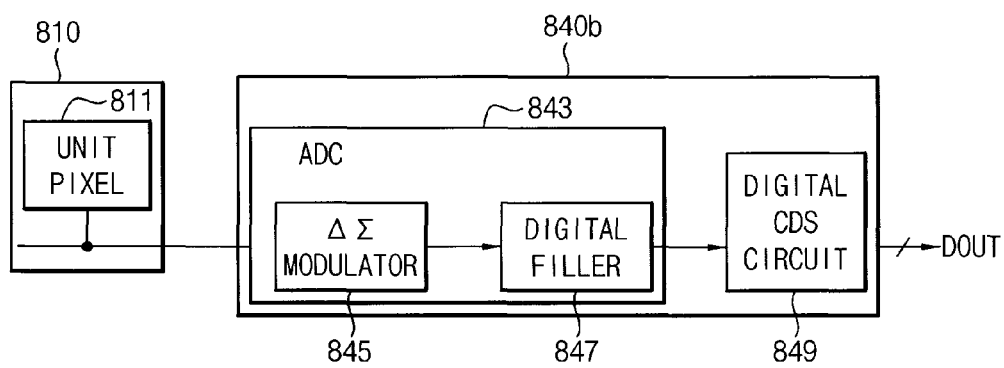
FIG. 11 is a block diagram illustrating another example of the image sensor of FIG. 9 according to some example embodiments.

FIG. 11 is a block diagram illustrating another example of the image sensor of FIG. 9 according to some example embodiments.

In FIG. 11, one unit pixel 811 and one converting block 840b are illustrated.

Referring to FIG. 11, the converting block 840b includes the ADC 843 and a digital CDS circuit 849. The DSM 845 performs the delta-sigma modulation on the analog signal from the unit pixel 811 to generate the N-bit code stream. The digital filter 847 may reduce high-frequency component noise by low-pass filtering the N-bit code stream or may lower a transmission speed of a digital output by employing a decimation filter. The digital CDS circuit 849 performs CDS on the digital output from the digital filter to generate the digital output data DOUT.

Figure 12:
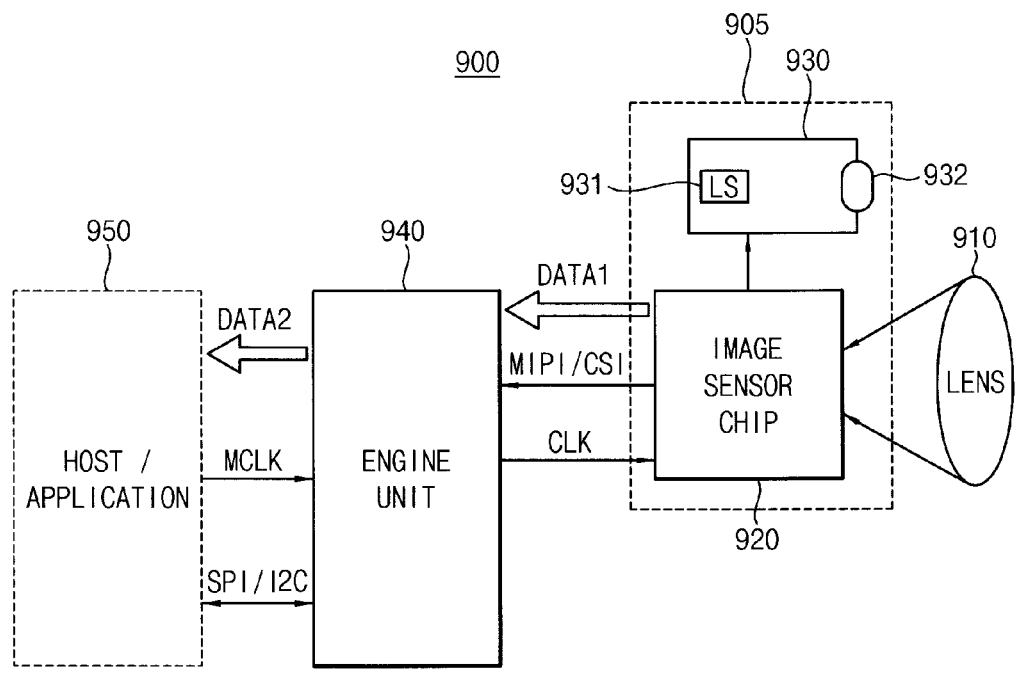
FIG. 12 is a block diagram illustrating an example of a camera including an image sensor according to some example embodiments.

FIG. 12 is a block diagram illustrating an example of a camera including an image sensor according to some example embodiments.

Referring to FIG. 12, a camera (also referred to as an image pick-up device) 900 includes a receiving lens 910, an image sensor 905 and an engine unit 940. The image sensor 905 may include an image sensor chip 920 and a light source module 930. In some example embodiments, the image sensor chip 920 and the light source module 930 may be implemented as separate devices, or may be implemented such that at least one component of the light source module 930 is included in the image sensor chip 920. The light source module 930 may include a light source 931 and a lens 932. The image sensor chip 920 may include a pixel array 810 having a plurality of unit pixels 811, a row decoder 820, a signal generator, an analog-to-digital converting block 840, a voltage adjusting circuit 850 and a regulator unit 860 as illustrated in FIG. 9. The voltage adjusting circuit 850 includes a replica inverter (Refer to 110 in FIG. 6) that has a same configuration as at least one inverter in the DSM 600 and adjusts the power supply voltage VDDC and the input voltage VCMC provided to the at least one inverter in the DSM 600 such that the regular current flows in the replica inverter 110 without regard to the variance of PVT as described with reference to FIGS. 1 through 8.

The receiving lens 910 may focus incident light on a photo-receiving region (e.g., depth pixels and/or color pixels) of the image sensor chip 920. The image sensor chip 920 may generate data DATA1 including depth information and/or color image information based on the incident light passing through the receiving lens 810a. For example, the data DATA1 generated by the image sensor chip 920 may include depth data generated using infrared light or near-infrared light emitted by the light source module 930, and red, green, blue (RGB) data of a Bayer pattern generated using external visible light VL. The image sensor chip 920 may provide the data DATA1 to the engine unit 940 in response to a clock signal CLK. In some example embodiments, the image sensor chip 920 may interface with the engine unit 940 using a mobile industry processor interface (MIPI) and/or a camera serial interface (CSI).

The engine unit 940 may control the image sensor 905. The engine unit 840 may process the data DATA1 received from the image sensor chip 920. For example, the engine unit 940 may generate color data based on the received data DATA1. In other examples, the engine unit 940 may generate luminance, chrominance (YUV) data including a luminance component (Y), a difference between the luminance component and a blue component (U), and a difference between the luminance component and a red component (V) based on the RGB data, or may generate compressed data, such as Joint Photographic Experts Group (JPEG) data. The engine unit 940 may be coupled to a host/application 950, and may provide data DATA2 to the host/application 950 based on a master clock signal MCLK. In some example embodiments, the engine unit 940 may interface with the host/application 950 using a serial peripheral interface (SPI) and/or an inter integrated circuit (I2C) interface.

Figure 13:
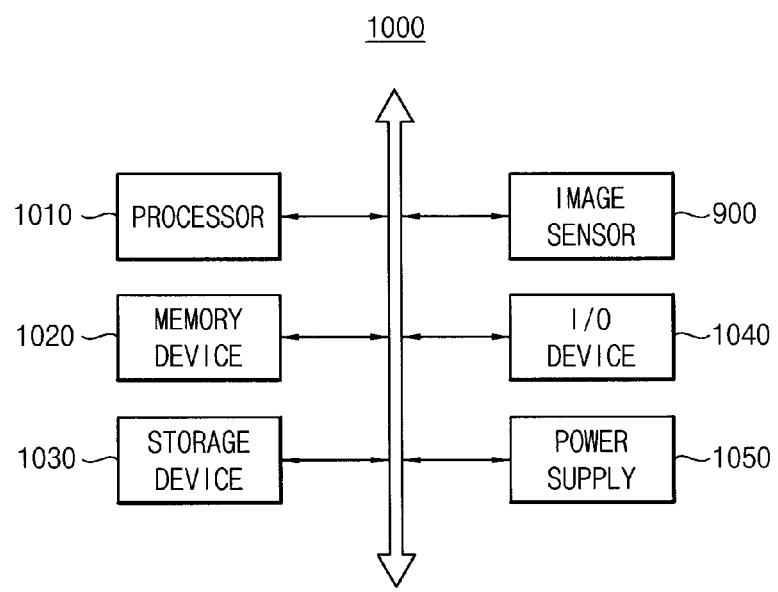
FIG. 13 is a block diagram illustrating a computing system including a camera according to some example embodiments.

FIG. 13 is a block diagram illustrating a computing system including a camera according to some example embodiments.

Referring to FIG. 13, a computing system 1000 includes a processor 1010, a memory device 1020, a storage device 1030, an input/output (I/O) device 1040, a power supply 1050 and an image sensor 900. Although it is not illustrated in FIG. 13, the computing system 1000 may further include a port for communicating with electronic devices, such as a video card, a sound card, a memory card, a USB device, etc.

The processor 1010 may perform specific calculations or tasks. For example, the processor 1010 may be a microprocessor, a central process unit (CPU), a digital signal processor, or the like. The processor 1010 may communicate with the memory device 1020, the storage device 1030 and the input/output device 1040 via an address bus, a control bus and/or a data bus. The processor 1010 may be coupled to an extension bus, such as a peripheral component interconnect (PCI) bus. The memory device 1020 may store data for operating the computing system 1000. For example, the memory device 1020 may be implemented by a dynamic random access memory (DRAM), a mobile DRAM, a static random access memory (SRAM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. The storage device 1030 may include a solid state drive, a hard disk drive, a compact disc read-only memory (CD-ROM), etc. The input/output device 1040 may include an input device, such as a keyboard, a mouse, a keypad, etc., and an output device, such as a printer, a display device, etc. The power supply 1050 may supply power to the computing system 1000.

The image sensor 900 may be coupled to the processor 1010 via the buses or other communication links. The DSM in the image sensor adjusts the power supply voltage VDDC and the input voltage VCMC such that regular current flows in the inverters in DSM without regard to the variance of the PVT. The image sensor 900 and the processor 1010 may be integrated in one chip, or may be implemented as separate chips.

In some example embodiments, the image sensor 900 and/or components of the image sensor 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The computing system 1000 may be any computing system including the image sensor 900. For example, the computing system 1000 may include a digital camera, a mobile phone, a smart phone, a personal digital assistants (PDA), a portable multimedia player (PMP), etc.

FIG. 14 is a block diagram illustrating an example of an interface used in a computing system of FIG. 13 according to some example embodiments.

Referring to FIG. 13, a computing system 1100 may employ or support a MIPI interface, and may include an application processor 1110, a camera 1140 and a display device 1150. A CSI host 1112 of the application processor 1110 may perform a serial communication with a CSI device 1141 of the camera 1140 using a camera serial interface (CSI). In some example embodiments, the CSI host 1112 may include a deserializer DES, and the CSI device 1141 may include a serializer SER. A DSI host 1111 of the application processor 1110 may perform a serial communication with a DSI device 1151 of the display device 1150 using a display serial interface (DSI). In some example embodiments, the DSI host 1111 may include a serializer SER, and the DSI device 1151 may include a deserializer DES.

The computing system 1100 may further include a radio frequency (RF) chip 1160. A physical interface (PHY) 1113 of the application processor 1110 may perform data transfer with a PHY 1161 of the RF chip 1160 using a MIPI DigRF. The PHY 1113 of the application processor 1110 may include a DigRF MASTER 1114 for controlling the data transfer with the PHY 1161 of the RF chip 1160. The computing system 1100 may further include a global positioning system (GPS) 1120, a storage device 1170, a microphone 1180, a DRAM 1185 and a speaker 1190. The computing system 1100 may communicate with external devices using an ultra wideband (UWB) communication 1210, a wireless local area network (WLAN) communication 1220, a worldwide interoperability for microwave access (WIMAX) communication 1230, etc. Example embodiments of the inventive concepts may not be limited to configurations or interfaces of the computing systems 1000 and 1100 illustrated in FIGS. 13 and 14.

As mentioned above, the image sensor and image processing system include the voltage adjusting circuit having a replica inverter that has a same configuration as the inverters of DSM in delta-sigma ADC and adjust the levels of the power supply voltage and the input voltage such that the regular current flows in the inverters without regard to the variance of PVT. Therefore, example embodiments may be applicable to various image sensing fields.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments of the inventive concepts. Accordingly, all such modifications are intended to be included within the scope of example embodiments of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An image sensor comprising:
   a delta-sigma analog-to-digital converter (ADC) including a delta-sigma modulator (DSM) configured to perform delta-sigma modulation on an analog signal from a unit pixel, the delta-sigma ADC configured to convert the analog signal to a digital signal; and
   a voltage adjusting circuit including a replica inverter having a same configuration as at least one inverter included in the DSM, the voltage adjusting circuit configured to adjust a power supply voltage and an input voltage provided to the at least one inverter based on a current flowing in the replica inverter.

2. The image sensor of claim 1, wherein the voltage adjusting circuit further comprises:
   a sensing circuit configured to sense first and second sensing voltages converted from the current flowing in the replica inverter to provide an output sensing signal;
   a first comparator configured to compare the output sensing signal and a first reference voltage; and
   a second comparator configured to compare the second sensing voltage and a second reference voltage,
   wherein the voltage adjusting circuit is configured to adjust the power supply voltage and the input voltage based on the output of the first comparator and the second comparator.

3. The image sensor of claim 2, wherein the replica inverter comprises:
   a p-channel metal-oxide semiconductor (PMOS) transistor that has a source coupled to the adjusted power supply voltage and a gate receiving the adjusted input voltage;
   a first resistor coupled to a drain of the PMOS transistor; and
   an n-channel metal-oxide semiconductor (NMOS) transistor that has a drain coupled to the first resistor, a gate receiving the adjusted input voltage and a source coupled to a ground voltage.

4. The image sensor of claim 3, wherein the first sensing voltage is provided at the drain of the PMOS transistor and the second sensing voltage is provided at the drain of the NMOS transistor.

5. The image sensor of claim 3, wherein the sensing circuit comprises:

a first operational amplifier that has a first positive input terminal configured to receive the first sensing voltage and a first negative input terminal connected to a first output terminal;

a second operational amplifier that has a second positive input terminal configured to receive the second sensing voltage and a second negative input terminal connected to a second output terminal; and a third operational amplifier that has a third negative input terminal coupled to the first output terminal through a second resistor, a third positive input terminal coupled to the second output terminal through a third resistor and third output terminal coupled to the third negative input terminal through a fourth resistor, and wherein the first negative input terminal is coupled to the second negative input terminal through a fifth resistor, the third positive input terminal is coupled to the ground voltage through a sixth resistor and the third output terminal provides the output sensing signal.

6. The image sensor of claim 5, wherein the second and third resistors have a same first resistance, the fifth and sixth resistors have a same second resistance, and the second resistance is as twice as the first resistance.

7. The image sensor of claim 3, wherein the NMOS transistor operates in a saturation region in response to the adjusted input voltage.

8. The image sensor of claim 1, further comprising:
a regulator unit configured to maintain levels of the power supply voltage and the input voltage to provide the power supply voltage and the input voltage to the delta-sigma ADC.

9. The image sensor of claim 8, wherein the regulator unit comprises:
a first regulator configured to maintain the level of the power supply voltage to be provided to at least one inverter included in the DSM; and
a second regulator configured to maintain the level of the input voltage to be provided to the least one inverter included in the DSM.

10. The image sensor of claim 1, wherein the delta-sigma ADC further comprises a digital filter, connected to an output of the DSM, which provides the digital signal.

11. The image sensor of claim 1, wherein the DSM comprises a plurality of cascade-connected switched-capacitor integrators, each of the switched-capacitor integrators configured to perform a sampling operation on a corresponding input signal in a first clock phase and configured to perform an integration operation using a corresponding inverter in a second clock phase.

12. The image sensor of claim 1, wherein each of the switched-capacitor integrators resets an input signal of the corresponding inverter to a reset voltage in a reset operation.

13. An image processing system comprising:
an image sensor; and
a processor configured to process an output signal from the image signal, the image sensor including,
a delta-sigma analog-to-digital converter (ADC) including a delta-sigma modulator (DSM) configured to perform delta-sigma modulation on an analog signal from a unit pixel, the delta-sigma ADC configured to convert the analog signal to a digital signal; and
a voltage adjusting circuit including a replica inverter having a same configuration as at least one inverter included in the DSM, the voltage adjusting circuit configured to adjust a power supply voltage and an input voltage provided to the at least one inverter based on a current flowing in the replica inverter.

14. An image sensor, comprising:
an analog-to-digital converter (ADC) including a delta-sigma modulator (DSM); and
a voltage adjusting circuit replicating a portion of the DSM, the voltage adjusting circuit configured to adjust a power supply voltage and an input voltage provided to the ADC based on output from the replicated portion of the DSM.

15. The image sensor of claim 14, wherein the voltage adjusting circuit is configured to adjust the power supply voltage and the input voltage such that a constant current flows in the ADC.

16. The image sensor of claim 14, wherein the voltage adjusting circuit is configured to measure a voltage difference across a resistor in the replicated portion of the DSM and configured to adjust the power supply voltage and the input voltage based on the voltage difference.

17. The image sensor of claim 16, wherein the resistor is connected between drains of a PMOS transistor and a NMOS transistor of an inverter included in the replicated portion of the DSM.

18. The image sensor of claim 14, wherein the voltage adjusting circuit further comprises:
a sensing circuit configured to sense first and second sensing voltages converted from a current flowing in the replicated portion of the DSM to provide an output sensing signal, wherein
the voltage adjusting circuit is configured to adjust the adjusted power supply voltage based on the first sensing voltage and a first reference voltage, and
the voltage adjusting circuit is configured to adjust the input voltage based on the second sensing voltage and a second reference voltage.

19. The image sensor of claim 14, wherein the voltage adjusting circuit further comprises:
a sensing circuit configured to sense first and second sensing voltages converted from the current flowing in the replicated portion of the DSM to provide an output sensing signal;
a first comparator configured to compare the output sensing signal and a first reference voltage; and
a second comparator configured to compare the second sensing voltage and a second reference voltage,
wherein the voltage adjusting circuit is configured to adjust the power supply voltage and the input voltage based on the output of the first comparator and the second comparator.

* * * * *